(12) United States Patent
Nalezinski et al.

(10) Patent No.: US 7,990,313 B2
(45) Date of Patent: Aug. 2, 2011

(54) RADAR ARRANGEMENT

(75) Inventors: Martin Nalezinski, München (DE);
Claus Seisenberger, Neufraunhofen (DE)

(73) Assignee: Siemens Aktiengesellschaft, Munich (DE)

( * ) Notice: Subject to any disclaimer, the term of this patent is extended or adjusted under 35 U.S.C. 154(b) by 368 days.

(21) Appl. No.: 12/373,451

(22) PCT Filed: Jul. 10, 2007

(86) PCT No.: PCT/EP2007/057013
§ 371 (c)(1),
(2), (4) Date: Jan. 12, 2009

(87) PCT Pub. No.: WO2008/006818
PCT Pub. Date: Jan. 17, 2008

(65) Prior Publication Data
US 2009/0309785 A1    Dec. 17, 2009

(30) Foreign Application Priority Data
Jul. 13, 2006   (DE) .......................... 10 2006 032 544

(51) Int. Cl.
*G01S 13/42* (2006.01)
*G01S 13/50* (2006.01)

(52) U.S. Cl. ............ 342/200; 342/27; 342/28; 342/103; 342/114; 342/159; 342/174

(58) Field of Classification Search .......... 342/200–204, 342/27–28, 69–70, 94, 109, 103, 114, 159, 342/174
See application file for complete search history.

(56) References Cited

U.S. PATENT DOCUMENTS

| | | | |
|---|---|---|---|
| 2,811,715 A | | 10/1957 | Baker, Jr. |
| 4,754,277 A | * | 6/1988 | Voyce .............................. 342/83 |
| 4,951,005 A | | 8/1990 | Babin |
| 4,965,533 A | | 10/1990 | Gilmore |
| 5,075,638 A | | 12/1991 | Babin et al. |
| 5,103,192 A | | 4/1992 | Sekine et al. |
| 5,349,310 A | | 9/1994 | Rieder et al. |
| 5,546,088 A | | 8/1996 | Trummer et al. |
| 5,831,481 A | | 11/1998 | Oga |
| 6,181,273 B1 | * | 1/2001 | Heide et al. .................... 342/130 |
| 6,317,075 B1 | * | 11/2001 | Heide et al. .................... 342/128 |

(Continued)

FOREIGN PATENT DOCUMENTS

DE          4030607 A1       4/1992

(Continued)

*Primary Examiner* — John B Sotomayor
(74) *Attorney, Agent, or Firm* — Laurence A. Greenberg; Werner H. Stemer; Ralph E. Locher (57) ABSTRACT

An FMCW radar has a variable frequency microwave signal source for outputting a microwave signal, a frequency divider, a phase-locked loop, a loop filter and a reference signal source. The frequency divider is connected between the output of the variable frequency microwave signal source and an input of the phase-locked loop. The loop filter is connected between the output of the phase-locked loop and the input of the variable frequency microwave signal source. The reference signal source is connected to an additional input of the phase-locked loop. The frequency divider is adjustable, in particular digitally adjustable. A method for operating an FMWC radar includes adjusting a variable frequency microwave signal source by way of a closed-loop control circuit which uses a reference signal of a reference signal source, especially of a quartz oscillator, as the reference value, and a frequency-divided output signal of the microwave signal source as the feedback value.

16 Claims, 4 Drawing Sheets

U.S. PATENT DOCUMENTS

| | | |
|---|---|---|
| 6,486,826 B1 | 11/2002 | Cramer et al. |
| 7,474,259 B2 * | 1/2009 | Manor .......................... 342/174 |
| 2003/0020647 A1 | 1/2003 | Yankielun |
| 2006/0187112 A1 * | 8/2006 | Nalezinski et al. ........... 342/118 |
| 2008/0186223 A1 * | 8/2008 | Mayer et al. .................. 342/109 |
| 2009/0309785 A1 * | 12/2009 | Nalezinski et al. ........... 342/200 |
| 2010/0007545 A1 * | 1/2010 | Nalezinski et al. ........... 342/104 |

FOREIGN PATENT DOCUMENTS

| | | | |
|---|---|---|---|
| EP | 0402736 | A2 | 12/1990 |
| EP | 0599609 | A1 | 6/1994 |
| EP | 0647857 | A1 | 4/1995 |
| EP | 0793348 | A1 | 9/1997 |
| EP | 0816872 | A1 | 1/1998 |
| EP | 0945715 | A2 | 9/1999 |
| EP | 2196822 | A2 * | 6/2010 |
| JP | 62210731 | A | 9/1987 |
| WO | WO 2004088353 | A1 * | 10/2004 |

\* cited by examiner

RADAR ARRANGEMENT

BACKGROUND OF THE INVENTION

Field of the Invention

The invention relates to radar arrangements and associated methods, in particular for traffic monitoring.

In presence detection, in particular in traffic engineering applications for detecting vehicle presence, distance and speed, radar sensors are frequently used in addition to optical systems. Said sensors are typically based on a Doppler radar, in particular in the form of a continuous wave (CW) radar.

With the Doppler radar, however, apart from the reflection amplitude, only a change in the reflection phase of the reflecting scenario can be detected in a way that is of practical use. Consequently, only the movement of an object, i.e. typically its speed, can therefore be measured. Traffic sensors operating according to this principle cannot perform any real static measurements, i.e. detect scenarios in which a measurement object comes to a halt and remains motionless in the detection zone. In practice, however, it is often desirable to perform a static measurement. This applies, for example, when the presence of a stationary vehicle is to be detected, such as, for example, at a red light or in front of a parking bay. Similarly, it is desirable in many situations to measure the movement of a vehicle only in a predefined distance range. That, too, is not possible with a pure Doppler radar.

In order to perform precise distance-selective measurements, it has been the practice in the prior art to use mainly sensitive and expensive optical sensors which are typically based on image-detecting concepts. These are usually too expensive for widespread use. Other concepts that can be used for static detection are laser-based. However, these are also expensive and not very robust against environmental influences.

In traffic applications, use is often made of radar sensors in the frequency range from typically 1 to 100 GHz, which operate exclusively according to the Doppler principle and consequently cannot perform static distance measurements. Instead, the presence of a vehicle is inferred based on a transient phase change which results when a vehicle moves into the detection zone and can be detected by means of a Doppler sensor. However, unavoidable drifting in the measurement signal, caused for example by changes in the reflectivity of the background or variations in temperature, also generate changes in phase and amplitude. With this method, said undesirable phase and amplitude changes basically cannot be distinguished from phase changes caused by the presence of objects, which often makes a detection unreliable.

The functionality in traffic applications can be significantly enhanced by using a distance-measuring radar, also commonly referred to by the name FMCW (Frequency-Modulated Continuous-Wave) radar. However, a conventional FMCW radar requires a frequency ramp that is detuned—ideally linearly—over time. Currently, however, traffic radar sensors operating according to the FMCW principle generally use unregulated signal sources which possess limited linearity and whose frequency is also heavily dependent (drift) on temperature. The non-linearity in the tuning characteristic increases the position uncertainty with which an object can be localized. In order to ensure that the transmitted frequency at all times remains within the frequency band made available by the authorities in spite of the temperature drift of the center frequency, a frequency band with the width of the temperature drift must remain unused in the permitted frequency range as a guard band. This appreciably reduces the usable tuning bandwidth of an unregulated FMCW radar, and consequently the spatial resolution of the sensor, which is proportional to the tuning bandwidth. Both effects ultimately reduce the sensitivity of the sensor. This means that unregulated systems for traffic detection possess limited sensitivity. A frequency regulation directly in the GHz range in turn cannot be realized economically in practical terms.

BRIEF SUMMARY OF THE INVENTION

It is therefore part of the object of the present invention to provide an economical and robust means for improved spatial resolution of an FMCW radar, in particular in the context of presence detection, specifically in traffic engineering.

This partial object is achieved at least by means of an FMCW radar as claimed in claim 1 and a method as claimed in claim 3. Advantageous embodiments are derivable in particular from the dependent claims.

With the FMCW radar, in particular in the form of a vehicle presence detector, an output signal of a tunable microwave signal source is divided by a digitally settable frequency divider having a division ratio n down to a very much deeper frequency which typically, but not necessarily, lies in the range from 1 to 100 MHz. Said signal is supplied to a phase-locked loop. There, the signal at said frequency is compared with a reference signal of a high-precision reference signal source, for example a quartz oscillator. The phase-locked loop then controls the frequency of the microwave oscillator by way of a loop filter.

In a further embodiment, an in particular digitally controlled frequency divider having the division ratio m is connected between the reference signal source and the phase-locked loop, where n then no longer has to be controllable digitally, though it can be. The frequency divider having the division ratio n serves to divide the frequency of the output signal of the tunable oscillator into a frequency range in which the phase-locked loop operates. In this case, therefore, the microwave signal divided by the divider ratio n is compared with the reference frequency divided by m. Said frequency typically, though not necessarily, lies in the range from 1 KHz to 100 MHz. A frequency ramp is tuned linearly by continuous variation of the very precisely settable division ratio n of the divider. The digitally controllable divider can be implemented in both embodiment variants for example either as an integer divider, as a fractional rational divider or as a DDS structure.

Using such a FMCW radar, in particular as a traffic detector, having a digitally controlled ramp produces the advantage that the available frequency range is optimally used, since an uncontrolled frequency drift of the tunable microwave signal source by way of the temperature no longer occurs and therefore no guard frequency band has to remain unused at the band limits. Tuning with a highly linear ramp increases the resolution of the sensor. As a result of both measures, the traffic detector possesses a higher sensitivity than a conventional traffic detector. Because the operating frequency lies in the microwave range, the proposed traffic detector is also very robust against environmental influences. This means that significantly improved detection rates can be achieved in traffic monitoring.

Furthermore, the traffic detector is also easier to manufacture than conventional radar sensors, since a transmission frequency conforming to radio approval standards can be produced without mechanical tuning measures during manufacture. As a result the sensor possesses a cost advantage compared with conventional FMCW sensors.

Equally advantageous is the possibility, owing to the FMCW principle, of limiting the motion detection to a specific distance range, e.g. by electronically setting a gate zone. In this way it is possible e.g. to detect pedestrians on a pedestrian crosswalk and at the same avoid detecting more remote moving objects, e.g. automobiles. This also permits a greater freedom in the choice of the installation site.

The following cases can occur here:

The Doppler frequency is very much less than the distance frequency. In that case a moving object which is located outside of the specified detection zone and possesses a high signal amplitude in the time signal nonetheless does not trigger a detection. This applies in the case of both a rising and a falling frequency ramp.

The Doppler frequency is comparable to or greater than the distance frequency. In this case the object frequency appears in the detection zone during the falling ramp, but not during the rising ramp. If the two spectra are assigned to the same object, the distance frequency without the Doppler component can be calculated as the arithmetic mean from both frequencies. Put simply, it can already be recognized from the jumping of the spectral line that the object under observation is not static. If the arithmetic mean value of the frequency of the jumping line in the detection zone up to the next jumping line outside of the detection zone also lies outside of the detection zone, there is also no moving object in the detection zone.

Conversely, the Doppler frequency of a moving object is shifted by its distance frequency. With a conventional Doppler sensor, slowly moving measurement objects generate low-frequency Doppler frequencies. These are attenuated or completely suppressed by the usually present DC decoupling in the measurement signal branch. In the case of motion detection by means of the inventive FMCW radar or, as the case may be, traffic sensor, the Doppler frequency of the measurement object is shifted by its distance frequency. It is now higher in frequency and consequently can pass the DC decoupling. As a result the inventive radar is very much more sensitive than a pure fixed-frequency Doppler radar.

The radar sensor according to the invention also has the advantage that with a frequency-regulated FMCW radar it is also possible to perform a motion detection in parallel, in addition to the actual distance measurement. The distance measurement signals are coherent relative to one another from measurement cycle (=one-time tuning of the frequency ramp) to measurement cycle, whereas by contrast the Doppler signals are not. This enables the highly sensitive motion detection to be carried out in parallel with the distance measurement. The high sensitivity of the motion detection results from the high phase deviation caused by a movement. Whereas the distance signal clearly changes in the event of a change in position of the measurement object in the order of $$d=0.5 \cdot c/\Delta f,$$

the Doppler signal changes already due to changes in position in the range of the wavelength of the sensor center frequency f0 according to:

$$d=0.5 \cdot c/f_0.$$

With typical bandwidths in the range of 100 MHz and a center frequency of typically 24 GHz, in the former case a clear change in the measurement signal takes place when movements occur in the range of 1.5 m, whereas the clear change in the Doppler signal results already in the case of a movement of 6 mm.

If an individual moving measurement object generates a Doppler signal of largely constant frequency, then this Doppler frequency can be clearly detected in the spectrum of the individual signal. When a plurality of magnitude spectra are averaged, this Doppler spectral line is preserved. In this case the Doppler line is basically not distinguishable from a distance line of a static object. In the case of a complex-valued, i.e. in-phase, averaging of successive measurement signals, on the other hand, a suppression of the Doppler component takes place, since this, in contrast to the distance component, is not coherent from measurement cycle to measurement cycle. Thus, all the Doppler signal components disappear in the spectrum of the complex-valued averaged measurement signal. This means that the Doppler signal becomes distinguishable from distance signals. A simultaneous, highly sensitive detection, separated according to static and moving objects, is possible.

As already explained, in presence detection, in particular in traffic engineering applications for detecting vehicle presence, distance and speed, radar sensors are frequently used in addition to optical systems. Said sensors are often Doppler radars, i.e. what are known as continuous wave (CW) radars. Essentially, these only detect changes in the reflection phase, that is to say changes in the reflecting scenario, and possibly also yield a single phase value which corresponds to the weighted phase of all of the objects contributing to the reflection.

True FMCW radars are also being used to an increasing extent for traffic applications. By means of a said radar it is possible to measure the distance to an object. In principle, therefore, it is suitable for performing static measurements, i.e. for detecting the presence of static objects by way of a distance measurement. In reality there arises the problem that the background too is a static object which often cannot be detected separately from the actual measurement object. In the case of a FMCW radar the ability to resolve two static objects separately from each other is namely determined by the available tuning bandwidth. For reasons of radio type approval, however, the tuning bandwidth B is usually significantly limited, i.e. if the distance between a measurement object and the background is small, the two reflections can no longer be differentiated as separate reflections. Small, in this context, means that the distance D between the object and the background is in the order of or less than $$D=c/B,$$

where c is the speed of light.

With a small bandwidth, therefore, no reliable static measurement can be performed, because the reflection of a measurement object and of the background cannot be detected separately. The distance value which is obtained from the overall measurement signal with and without object does not differ deterministically from the measurement signal which has only the background reflection, referred to as the zero signal. This means that whenever both reflections cannot be resolved separately, the distance value determined with the object can grow or shrink compared to just the zero signal.

A change in the static measurement signal is used in the prior art in order to detect a static measurement object by means of a narrowband radar. If the measurement signal component belonging to given background reflections is known, and is subtracted from the overall measurement signal, only the signal component belonging to a possibly present measurement object remains. If the difference signal exceeds a predefined threshold value, an object is detected.

Physically, it is not possible in principle to distinguish the signal of an arbitrary object and an arbitrary zero signal from each other without further measures. Consequently, the background component in the measurement signal can only be obtained by first measuring the detection zone without measurement object and subsequently subtracting said signal from all of the measurement signals. However, this method only works well for a short time period, since after a certain time drifting in the radar sensor or the background changes the background signal. Drifts typically occur slowly and are attributable for example to changes in the reflectivity of the background due to arriving rain or contamination, etc. Within the sensor, drifting of the signal phase, the transmission frequency or signal amplitudes occurs e.g. due to changes in temperature. This means that the stored zero signal no longer corresponds to the current one, and an effective subtraction is no longer possible. Consequently, the zero signal has to be continuously adapted to such changes in the background during the current measurement. At the same time it must be ensured that the zero signal is adapted only to take account of changes actually resulting due to drifting, and not changes resulting due to the occurrence of an object echo.

Thus, a further part of the object of the present invention is to enable distance measurements of static objects to be reliably performed even with a drifting background signal, in particular also by means of a CW radar or a narrowband FMCW radar.

Said partial object is achieved by means of methods as claimed in claim 5 and/or 6. Advantageous embodiments may be derived in particular from the dependent claims.

The method is based on the determining of the difference between the current measurement signal and an adaptively corrected zero signal. In this case the undesirable background signal is adaptively corrected during the measurements to drifting of the sensor or background, with changes in the background caused by measurement objects being detected. With this method, the reflection of the background should change only "slowly", i.e. not suddenly, and/or should change in a way which differs in its characteristic from changes that are caused by measurement objects.

A prerequisite for a measurement signal to be effectively usable as a zero signal is that no movement takes place in the detection zone at the time of signal acquisition, i.e. that no Doppler signal is present. As long as objects are moving into or through the monitoring zone, they generate a perceptible Doppler signal in contrast to the static background. The presence of a measurement object is obvious; in pedestrian detection, for example, a Doppler signal is usually generated during the entire time the pedestrians remain within the radar beam. A real background, on the other hand, is effectively static, i.e. the background signal contains practically no Doppler signal. Thus, while the Doppler signal component remains above a predefined value or signal threshold, objects are moving in the detection zone.

The Doppler component can be detected using a number of methods, e.g. by analysis of a time signal and/or a signal spectrum. A moving object corresponds to a high signal amplitude in the time signal, a spectral line in the frequency range or a frequency band which clearly stands out from the noise. A particularly advantageous method of detecting a Doppler component consists in comparing two consecutive measurements with each other. If these differ by more than a predefined threshold value, a Doppler signal is present.

If no Doppler signal is present, the background signal can be adaptively corrected. For that purpose the background signal is measured at regular time intervals. These putative zero signals are stored sequentially in a table. The length of the time interval $\Delta\tau$ between two measurements is adapted to the typical speed with which the zero signal changes. Typical times for traffic applications lie in the range of several seconds to several tens of seconds. A putative background signal is only stored if no significant Doppler signal is determined in the measurement signal. The zero signal can be stored as a time signal or as a spectrum. Equally effectively, however, individual features can also be stored in the table and compared with the corresponding feature of the current measurement signal. Features can include e.g. the frequency of the maximum in the spectrum or the amplitude of the maximum.

The background is adapted e.g. by searching through the table for the most probable background signal, e.g. for that signal waveform that with a slight deviation is stored most frequently in the table. The current measurement signal is compared with said stored signal. If the difference is less than a predetermined threshold value, the current measurement signal is identified as a zero signal. Based on the agreement of the current measurement signal with a plurality of previously stored putative zero signals from the table, the current signal can be detected with a higher level of reliability as a zero signal. For the purpose of comparison, a plurality of measurement signals and/or also a plurality of zero signals can be averaged if necessary in order to compensate for differences caused by noise and clutter. The length of the table, and hence the checkable time period in which measurements were recorded, can be used to set the hold time for the static detection. For traffic applications this typically lies between a few minutes up to several tens of minutes.

A change in the measured reflection that occurs "quickly" or suddenly also leads to an object detection if the change subsequently persists statically. A static measurement is thus possible. If the measurement signal returns within a predefined time period to a signal which is similar to the most probable zero signal, the detection is suspended. If, on the other hand, the change persists beyond said time period, said static signal is assumed as a new background signal. If the change originated from a measurement object which remained in the detection zone for longer than the hold time, it is no longer detected. If it subsequently moves out of the detection zone again, a change compared with the incorrect zero signal is detected and consequently the presence of a measurement object is erroneously identified. The erroneous detection persists until the zero signal has been reset as a result of a new exceeding of the hold time. Considered from this perspective, a short time constant is desirable so that a detection error will be quickly corrected. In order to take account of different measurement situations, the time constant can be adaptively adjusted to match the situation. Equally, nested tables with different hold times can be used in order e.g. to pre-evaluate faster reflection changes and supply a zero signal determined after this pre-evaluation to a table for slow background changes.

The choice of the length of this time period therefore determines how slowly a reflection change due to an object may take place before this is detected as a background change. By adjusting the hold time the method can be optimally tailored to the measurement task (for example, a shorter hold time can be set for detecting pedestrians and a longer hold time for detecting vehicles).

Small changes constantly developing between successive measurements are likewise detected as changes to the background. By using as long a table as possible, comparisons with many zero signals can be carried out, thus allowing a highly reliable validity check. A zero signal can be kept constant during the entire hold time and at the moment at which it is interpreted as invalid, promptly replaced by a new zero signal.

Equally with FMCW radar, different hold times can be chosen for different distance/frequency ranges of the measurement signal in order, for example, to evaluate drifting in the sensor (very low measurement signal frequency) differently from object/zero signals (higher measurement signal frequency).

With the described method of adaptive background correction, further features of the background and object reflection, if present, can be used in order to differentiate static measurement objects from the background signal. For example, the transition from one static state to another (e.g. based on typical Doppler signatures) can allow an inference to be made as to whether a signal change took place as a result of a "fast" background change or a "slow" object change.

Another method of adaptively correcting the zero signal consists in averaging successive signals in a floating or blockwise manner. In this case typical averaging methods are possible. During averaging, "outliers", i.e. occasional measurement errors, are also incorporated in the formation of the zero signal. Moreover, the valid zero signal changes gradually. As a result a static object which remained for a relatively long time in the detection zone changes the current zero signal. Consequently, averaging is only useful for short hold times.

Using the detection method described, both static and moving objects can be detected also by means of a narrowband FMCW or Doppler radar. In both cases the current measurement signal deviates from the stored zero signal. The method requires no calibration at installation time. After the sensor has been switched on, the background signal is gradually formed in accordance with the above-described sequence. If the zero signals are stored in a nonvolatile memory, static detection can be resumed directly after the sensor is switched on. Short, in this context, means that the time is shorter than a significant change in the background reflection.

When a plurality of FMCW radar systems are deployed, the problem that arises in practice is that in situations in which multiple systems are in use these systems can irradiate and "blind" one another. This case occurs in particular when the frequency range in which the sensors are allowed to transmit is very narrow and each sensor is using the maximum available bandwidth.

In the normal case the individual sensor transmits regular frequency ramps (at a bandwidth of typically 0.1 GHz to 1 GHz), receives this signal reflected from targets and merges it with the current transmit signal. The distance and speed information relating to the irradiated target is contained in the therein resulting and usually very low-frequency intermediate frequency (ZF) or difference frequency signal (frequency typically from 0.01 KHz to 1000 KHz). In this case an individual measurement corresponds to the sending and receiving of an individual ramp. If a plurality of FMCW radar sensors are present, the individual sensor receives not only the reflection of its own transmit signal but also the transmitted frequency ramps of the other sensors either directly or via reflections. In particular, if a sensor radiates into a second sensor over a short path and hence at high power, said receive signal is merged in the second sensor with the latter's current transmit signal to form a ZF signal with very high amplitude. Most of the time during the frequency ramp the frequencies of the two signals are separated from each other by significantly more than 1 MHz. Thus, the ZF signal consequently lies significantly above the ZF bandwidth in frequency and is suppressed by filtering. A signal which lies spectrally in the range of the actual useful signal is produced as a difference frequency signal only at times at which two frequency ramps cross or intersect. Said signal is superimposed on the actual useful signal and makes the latter unusable for evaluation purposes during a short time segment of a measurement. This problem can occur e.g. in traffic control systems, where a plurality of radar sensors can be installed at intersections or pedestrian crosswalks in order to monitor a plurality of zones of the traffic space.

In the prior art, performing measurements in the presence of further radar sensors that radiate strongly into the system under consideration is either not possible or possible only with significantly reduced sensitivity. Furthermore, in systems that consist of a plurality of radar sensors, sensors of similar type, i.e. sensors whose ramps, with a slight tolerance, exhibit a similar time characteristic often blind one another; in that case an interference occurs over the course of many measurements practically always at the same time within the measurement. If two sensors are completely synchronized, the ramps run practically in parallel, in which case the sensors mutually interfere with each other during the entire measurement.

If the time of the overlap cannot be established, it is impossible to change the interference-affected range of the measurement signal and consequently the entire measurement is invalid. If, conversely, the sensors run with a controlled offset relative to each other, on the one hand the time of the interference is known, and on the other hand it always recurs at the same time within the measurements in terms of the precision of the ramp control. As the sensors usually cannot communicate with one another, a controlled synchronization cannot be achieved.

It is therefore another part of the object of the present invention to provide a means of simple and reliable suppression of interference to an FMCW radar caused by other Doppler radars.

This partial object is achieved at least by means of a method as claimed in claim 8. Advantageous embodiments may be derived in particular from the dependent claims.

The detection and/or suppression of the interference signal is based from one perspective on synchronizing the ramps of FMCW radars with one another in such a way that they no longer interfere with one another.

This can happen as follows, for example:

In one case the interference takes place via the amplitude, for if two sensors irradiate each other directly, the resulting ZF interference signal possesses a significantly higher amplitude than the useful signal. If desired, a clearer discrimination of the interference signal from the useful signal can advantageously be achieved by an additional high-pass filtering/differentiation. Contrary to the useful signal, the interference signal on principle always reaches up to the band limit of the ZF filter.

Alternatively or in addition, the time of the crossover of the ramps is obtained via the time-resolved spectrum of the ZF signal. In this case the time signal is examined spectrally piece by piece, for example, and a short broadband signal section identified as a crossover. If the time of the interference is known, the ZF signal can be "interference-suppressed". The following methods advantageously present themselves as suitable for that purpose:

If the sensors operate in a frequency band which is narrower than the overall frequency band, a frequency offset of the individual sensors relative to one another comes into consideration in order to suppress interference to the individual sensors. A prerequisite is that the frequency band is wide enough for all the bands of the sensors involved to fit next to one another. This is often not the case.

Alternatively, the time range of the ZF signal in which the interference is present can be "blanked". This essentially entails setting the measurement points of the interference to zero. This, however, effectively results in a loss of bandwidth, possibly a considerable loss, because the usable time signal becomes shorter.

Alternatively, the ZF signal can also be interpolated at a low frequency.

Advantageously, a weighting function is used for blanking out, thereby reducing the adverse impact on the frequency spectrum as a result of the blanking-out range.

If the time offset of the two mutually interfering ramps was detected from the time of the interference signal in the time range, a synchronization or deliberate non-synchronicity of the two radar systems can be achieved. For that purpose the start time of the ramps can be e.g. shifted in such a way that a sufficiently large frequency offset exists at all times to ensure that the interference signal lies clearly outside the bandwidth of the ZF filter, but at the same time a minimum of the useful signal is lost. The crossover point is particularly advantageously placed at the start or end of the frequency ramp. The measurement signal is advantageously weighted with a window function which suppresses the signal components considerably at the edges of the measurement. In this case the amplitude of the interference is likewise strongly attenuated by the window function.

A combination of the methods is also possible. In one embodiment the interference is shifted e.g. to the edge zone and additionally blanked out in the time domain.

The proposed methods presuppose that the sensors "come to an agreement with one another" in order to be able to control which sensor shifts the start time of the ramp in which direction.

This communication can take place wirelessly by radio or by cable. Alternatively, one sensor can be defined as the "master", and one or more other sensors can be defined as "slaves". In this case only one slave detects the interference and shifts its start time in accordance with a predefined interference suppression target.

If two or more sensors are to come to an arrangement totally without configuration and communication, random methods can be applied for example. In this case the time of the ramp start in both sensors can be randomly shifted within predefined limits. Conceivable here, inter alia, are the following approaches, which are implemented by way of example using two CW sensors:

The sign of the time offset per sensor is random: Both sensors shift their ramp start by the time period±t, where the sign is random. If both sensors jump in the same direction, the time of the interference remains stationary, viewed relatively. If the sensors jump in opposite directions, the sign is retained and the ramp shifted until the predefined target is reached.

The amount of the time offset per sensor is random: Both sensors shift the ramp by a random time t1 and t2 in the same direction. If the ramps move in the right direction relative to each other, they are shifted until the predefined target is reached.

The number of frequency ramps up to synchronization is random: Each sensor synchronizes only after a random number of mutually interfering ramps. What is achieved with a high degree of probability thereby is that two or more sensors will not perform the synchronization at the same time. Thus, if the synchronization using this method is only performed on one sensor, the other sensors detect the already performed synchronization in the subsequent ramps and thereupon dispense with synchronization steps of their own. In this case the synchronization is preferably performed in such a way that the required time offset is determined from the position in time of the interference in the measurement signal and the desired time sequence (synchronicity) is achieved in one step by introducing a corresponding time offset. In this way a system consisting of a plurality of sensors can be synchronized and kept in synchronism without further communication between the sensors. To enable each sensor to check the synchronization it is particularly advantageous if the sensors are allowed to synchronize themselves for example only when the frequency is tuned up. Then the tuning-down process always remains for checking the synchronicity (or vice versa).

The tuning of a ramp per se is random: The sensors discontinue randomly with their ramp. In this case a crossing-over of the ramps is avoided in that one sensor remains with the frequency at the edge of the useful band until the duration of one or more ramps has elapsed.

Combinations of the aforesaid approaches are also possible. Preferably, familiar probability calculation and system optimization methods will be used.

Essentially these methods work with two or more sensors.

If, on the other hand, the frequency of the sensors relative to one another is shifted, time range methods can be applied analogously to the frequency range.

If one sensor is an FMCW radar, and the other a CW Doppler sensor, this is likewise detected by the aforesaid methods.

Interference suppression of FMCW and non-FMCW Doppler radars is therefore also encompassed by the inventive concept. If an FMCW radar experiences interference due to a CW radar, the interference always takes place at the same time within the ramp, and moreover irrespective of any ramp shift. Only a frequency shift of the ramp leads to a shift in time of the interference. Consequently only blanking comes into consideration for interference suppression. By using a plurality of blanking-out zones it is also possible to eliminate interferences caused by more than two CW radar devices. In the Doppler sensor, interference due to an FMCW radar is detected on account of the fact that the interference occurs regularly. Possible methods for suppressing the interference include, inter alia, blanking and averaging, as described hereintofore.

The invention is explained in greater detail with the aid of exemplary embodiments and with reference to the following schematic figures.

BRIEF DESCRIPTION OF THE SEVERAL VIEWS OF THE DRAWING

FIG. 4A-4C show a signal plotted in arbitrary units against a frequency, i.e. in FIG. 4 (a) a common signal waveform of a background signal and a signal of a moving object, in FIG. 4 (b) a signal waveform of the background signal only, and in FIG. 4C a signal waveform of the object signal only;

DESCRIPTION OF THE INVENTION

Figure 1:
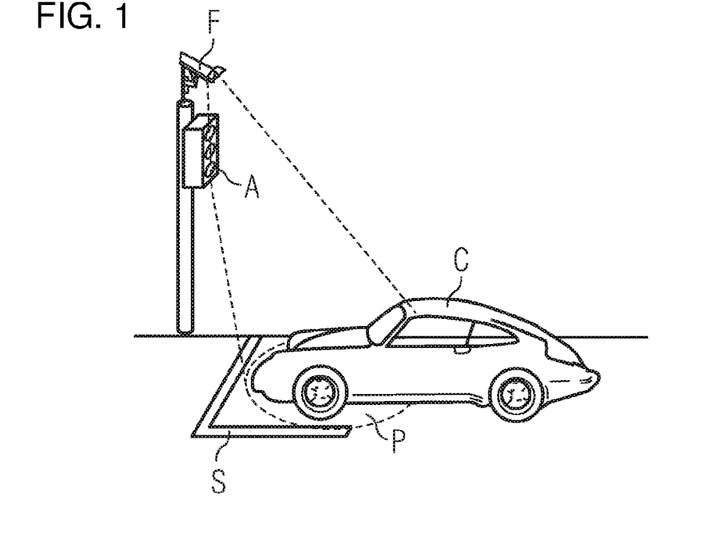
FIG. 1 shows a schematic of an FMCW radar arrangement for stopline detection in an oblique view.

FIG. 1 shows an FMCW radar arrangement for stopline detection having an FMCW radar F which is installed above a stoplight A and has an illumination zone P on a roadway which has a stopline S. The presence of a stationary vehicle C at the stopline S can be detected by means of the FMCW radar F.

Figure 2:
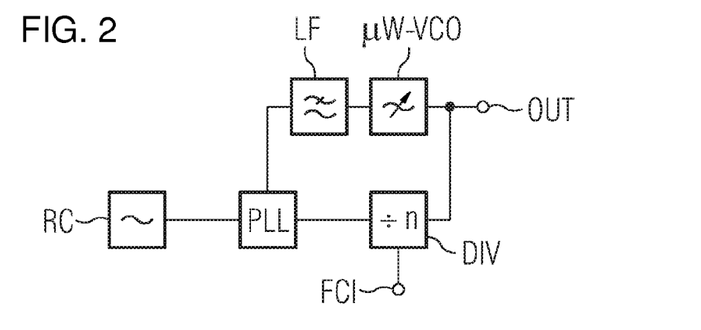
FIG. 2 shows a schematic circuit layout of a high-precision signal generation unit of an FMCW radar, e.g. from FIG. 1.

FIG. 2 shows a schematic circuit layout of a high-precision signal generation unit of the FMCW radar for ramp control having a divider DIV with divider ratio n (integer or fractionally rational) in the microwave signal.

The output signal OUT of the tunable microwave signal source µW-VCO is divided by a digitally settable frequency divider DIV having the division ratio n down to a very much deeper frequency which typically, but not necessarily, lies in the range from 1 to 100 MHz. Said frequency-divided signal is supplied to a phase-locked loop PLL. There, the signal is compared with the reference signal at just this frequency, which reference signal originates from a quartz oscillator as a highly precise signal source RC. The PLL controls the frequency of the microwave oscillator µW-VCO via a loop filter LF. In other words, the microwave signal source µW-VCO is therefore set by means of a control loop which uses a highly precise reference signal as a reference variable. The division ratio n can be set digitally by means of a divider control input FCI.

Figure 3:
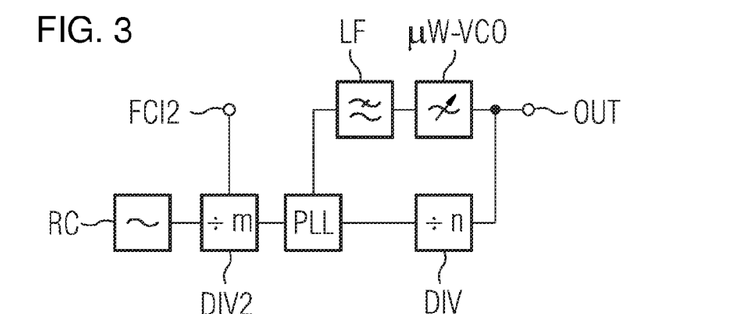
FIG. 3 shows a schematic circuit layout of a further high-precision signal generation unit of an FMCW radar, e.g. from FIG. 1.

FIG. 3 shows a schematic circuit layout of a high-precision signal generation unit of the FMCW radar for ramp control having, in comparison with FIG. 2, an additional divider DIV2 with the divider ratio m (integer or fractionally rational) in the reference signal response between the reference source RC and the phase-locked loop PLL. The divider ratio m of the additional divider DIV2 is digitally settable by means of an associated divider control input FCI2.

In this arrangement the frequency divider DIV2 is (digitally) controlled, which means that the division ratio n of the divider DIV then no longer has to be (digitally) controllable, but can be. The divider DIV having the division ratio n serves to divide the frequency of the output signal OUT of the VCO into a frequency range in which the phase-locked loop PLL functions. In this case, therefore, the microwave signal OUT divided by the divider ratio n is compared with the reference frequency divided by m of the reference signal source RC. Said reference frequency typically, though not necessarily, lies between 1 KHz and 100 MHz. A frequency ramp is linearly tuned by continuous variation of the very precisely settable division ratio of the second divider DIV2.

The digitally controllable dividers DIV, DIV2 in FIG. 2 or 3 can be implemented either as integer or as fractionally rational dividers, or as a DDS structure.

Figure 4A:
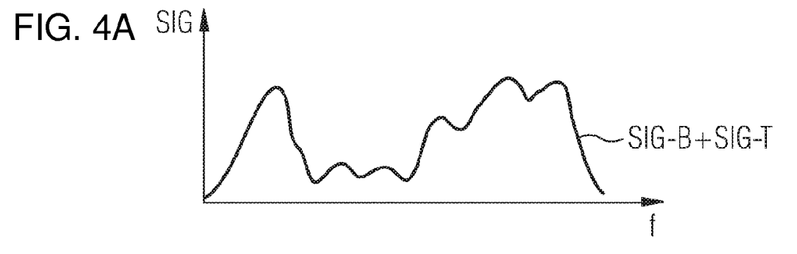
Figure 4B:
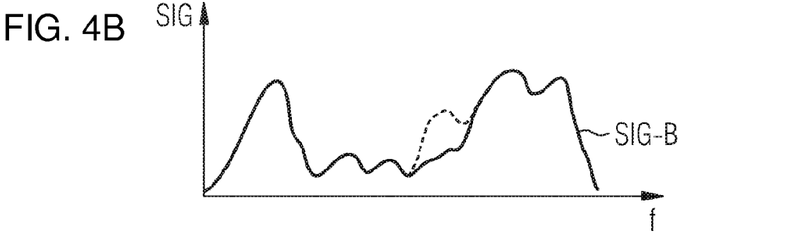
Figure 4C:
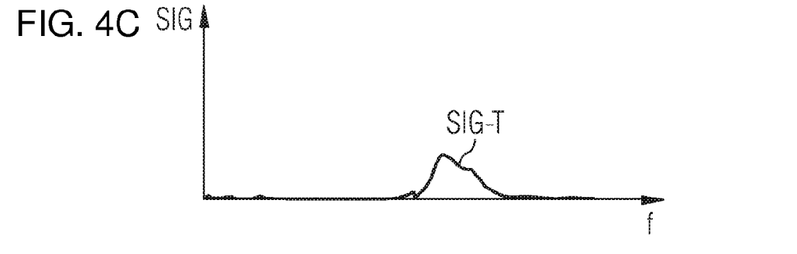

FIG. 4 shows three sub-diagrams in which a radar signal SIG is plotted in arbitrary units against an associated frequency f, i.e. in FIG. 4(*a*) a common signal waveform of a background signal SIG-B and a signal of a moving object SIG-T, in FIG. 4(*b*) a signal waveform of the background signal SIG-B only, and in FIG. 4C a signal waveform of the object signal SIG-T only.

Figure 5A:
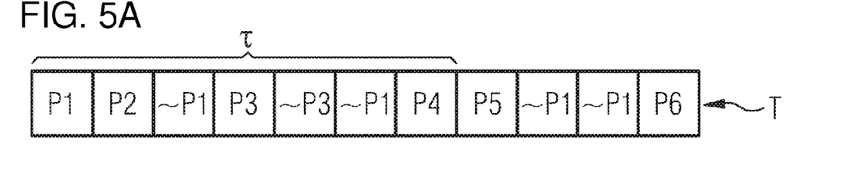
FIG. 5A-5C show putative background or zero signals that are stored in a table for the purpose of adaptively correcting a background signal, e.g. of the FMCW radar from FIG. 1.
Figure 5B:
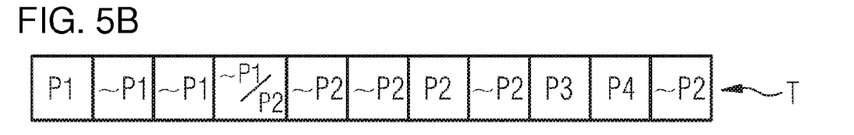
Figure 5C:
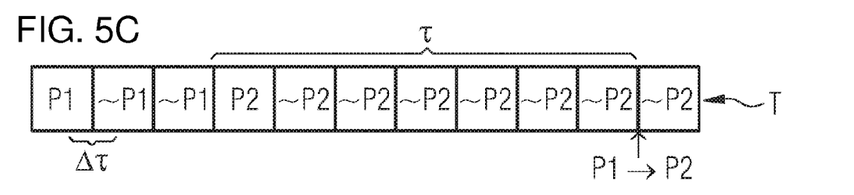

FIGS. 5A-5C show putative background or zero signals P that are stored in a table T for the purpose of adaptively correcting a background signal, e.g. of the FMCW radar from FIG. 1.

If no Doppler signal is present, the background signal SIG-B from FIG. 4 can be adaptively corrected. For that purpose, the background signal SIG-B from FIG. 4 is measured at regular time intervals $\Delta\tau$. These putative zero signals (P1, P2, . . . ) are stored sequentially in a table T, as shown in FIG. 5A. The length of a time interval $\Delta\tau$ between two measurements Pn, Pn+1 (n$\geq$1) is matched to the typical speed at which the zero signal Pn changes. Typical times for traffic applications lie in the range of several seconds to several tens of seconds. A putative background signal Pn is stored only if no significant Doppler signal is determined in the measurement signal. The zero signal Pn can be stored as a time signal or as a spectrum. Equally effectively, however, only individual features can also be stored in the table and compared with the corresponding feature of the current measurement signal. Features can include e.g. the frequency of the maximum in the spectrum or the amplitude of the maximum.

The adaptive correction of the background takes place e.g. by searching through the table for the most probable background signal, e.g. for that signal waveform which, with a slight deviation, is stored most frequently in the table, as likewise shown in FIG. 5A. The current measurement signal is compared with said signal waveform. If the difference undershoots a predetermined threshold value, the current measurement signal is identified as a zero signal. If the current measurement signal matches a plurality of previously stored putative zero signals P1-P6 from the table, the current signal can be recognized with a higher level of certainty as a zero signal. If necessary, a plurality of measurement signals and/or also a plurality of zero signals can be averaged for the comparison in order to compensate for differences caused by noise and clutter. The length of the table, and hence the checkable time period in which measurements were recorded, can be used for setting the hold time $\tau$ for the static detection. In traffic applications this typically ranges between a few minutes up to several tens of minutes.

A change in the measured reflection that occurs "quickly" or suddenly also leads to an object detection when the change subsequently persists statically. A static measurement is thus possible. If the measurement signal returns within a pre-defined time period to a signal which is similar to the most probable zero signal, the detection is suspended. If, on the other hand, the change persists beyond said time period, said static signal is assumed as a new background signal, as shown symbolically in FIG. 5C. If the change originated from a measurement object which remained in the detection zone for longer than the hold time, it is no longer detected. If it subsequently moves out of the detection zone again, a change compared with the incorrect zero signal is detected and consequently the presence of a measurement object is erroneously identified. The erroneous detection persists until the zero signal has been reset as a result of a new exceeding of the hold time. Considered from this perspective, a short time constant is desirable so that a detection error will be quickly corrected. In order to take account of different measurement situations, the time constant can be adaptively adjusted to match the situation. Equally, nested tables with different hold times can be used in order e.g. to pre-evaluate faster reflection changes and supply a zero signal determined after this pre-evaluation to a table for slow background changes.

The choice of the length of this time period therefore determines how slowly a reflection change due to an object may take place before this is detected as a background change. By adjusting the hold time the method can be optimally tailored to the measurement task (for example, a shorter hold time can be set for detecting pedestrians and a longer hold time for detecting vehicles).

Small changes constantly developing between successive measurements, such as correspond to a sequence as in FIG. 5B, are likewise detected as a change in the background. By using as long a table as possible, comparisons with many zero signals Pn can be carried out, thus allowing a highly reliable validity check. A zero signal Pn can be kept constant during the entire hold time and, at the moment at which it is interpreted as invalid, promptly replaced by a new zero signal Pn. Equally, with FMCW radar, different hold times can be chosen for different distance/frequency ranges of the measurement signal in order, for example, to evaluate drifting in the sensor (very low measurement signal frequency) differently from object/zero signals (higher measurement signal frequency).

By this means a synchronization of the frequency ramps is made possible without the sensors having an additional communication channel or additional hardware being necessary.

Figure 6:
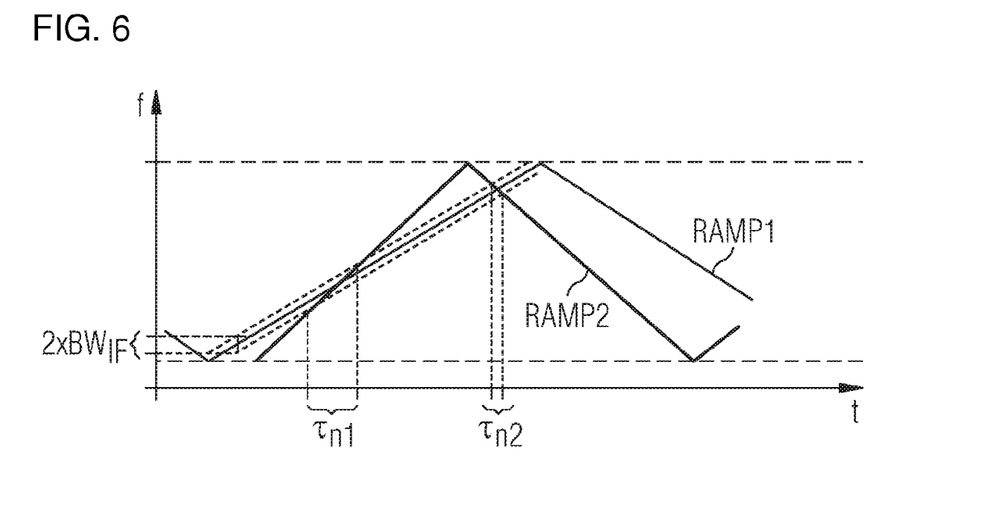
FIG. 6 shows in a plotting of a frequency against time two ramps of mutually interfering FMCW radars having a different ramp shape.

FIG. 6 shows in a plotting of a frequency f against a time t two ramps RAMP1, RAMP 2 of mutually interfering FMCW radars having a different ramp shape (different timing). In this case intersections occur in two time ranges $\tau_{n1}$ and $\tau_{n2}$ of different length.

Figure 7:
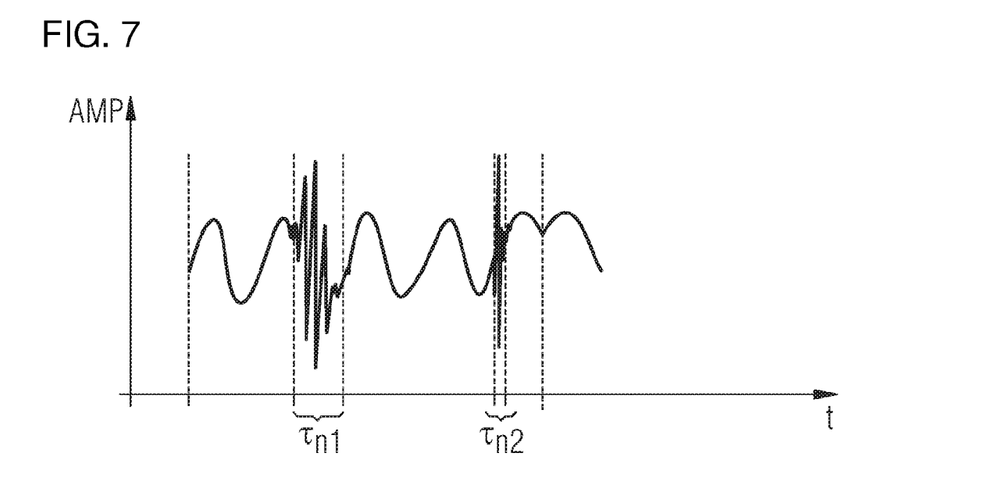
FIG. 7 shows in a plotting of an amplitude against time the sensor signal resulting in the case of one of the mutually interfering FMCW radars from FIG. 6.

FIG. 7 shows in a plotting of an amplitude AMP against a time t the sensor signal resulting in the case of one of the mutually interfering FMCW radars from FIG. 6. The amplitude signal AMP is subject to considerable interference in the two intersection time ranges $\tau_{n1}$ and $\tau_{n2}$.

Figure 8:
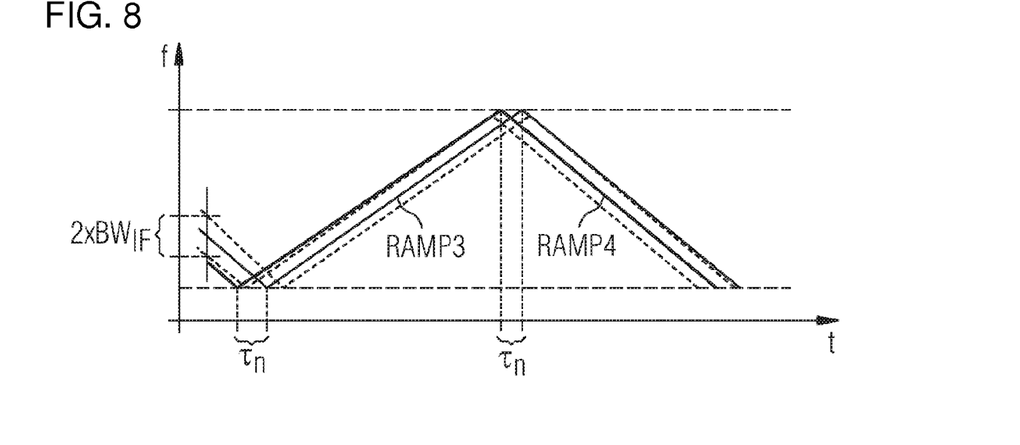
FIG. 8 shows in a plotting of a frequency against time two ramps of mutually interfering FMCW radars having the same, but offset ramp shape.

FIG. 8 shows in a plotting of a frequency f against a time t two ramps RAMP3, RAMP 4 of mutually interfering FMCW radars having the same, but offset ramp shape (same timing) with a crossover of the ramps RAMP3, RAMP 4 at the end of the ramp and start of the ramp. In this case intersections occur in two time ranges $\tau_{n31}$ of equal length.

Figure 9:
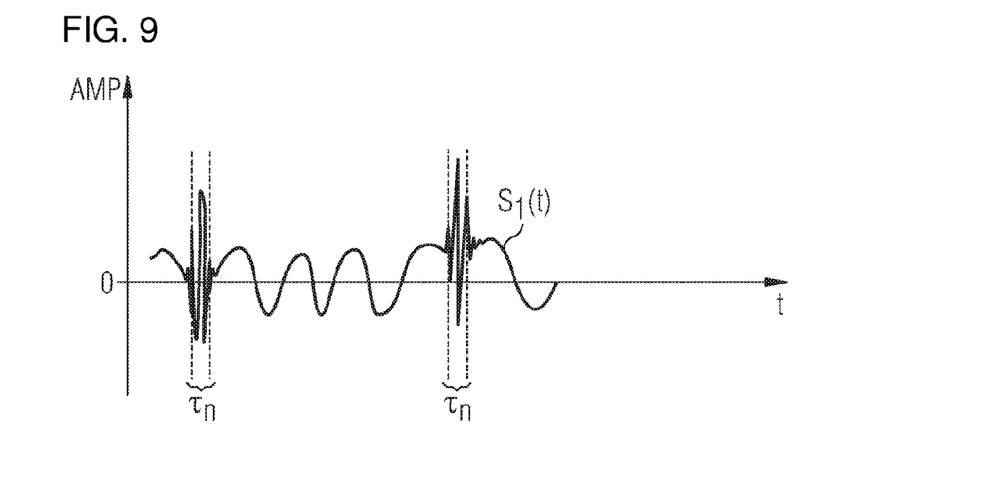
FIG. 9 shows in a plotting of an amplitude against time the sensor signal resulting in the case of one of the mutually interfering FMCW radars from FIG. 8.

FIG. 9 shows in a plotting of an amplitude AMP against a time t the sensor signal $S_1(t)$ resulting in the case of one of the mutually interfering FMCW radars from FIG. 8. The amplitude signal AMP is subject to considerable interference in the two intersection time ranges $\tau_{n3}$.

Figure 10:
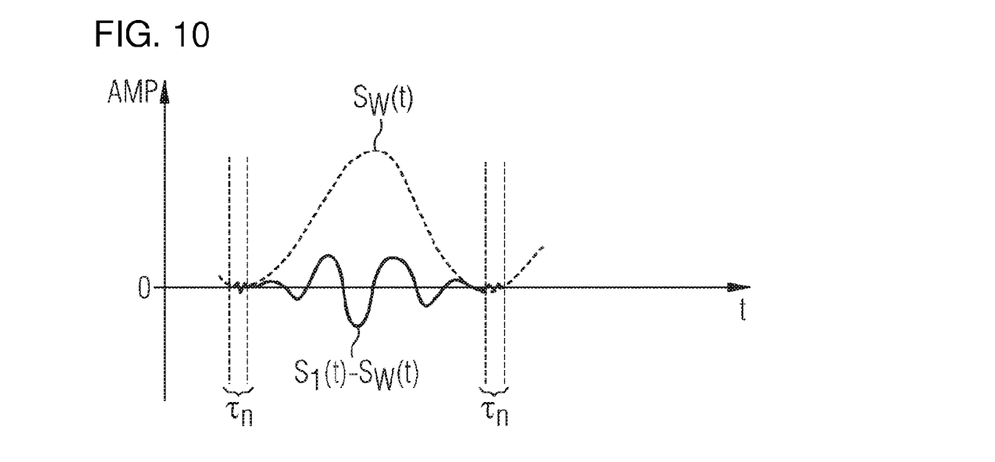
FIG. 10 shows in a plotting of an amplitude against time a blanking out of a crossover of ramps from FIG. 8 with weighting function.

FIG. 10 shows in a plotting of an amplitude AMP against a time t a blanking-out of a crossover of the ramps RAMP3, RAMP4 from FIG. 8 by subtraction of a weighting function or, as the case may be, a weighting signal $S_W(t)$ from the sensor signal $S_1(t)$ from FIG. 9. The weighting signal $S_W(t)$ suppresses in particular the sensor signal $S_1(t)$ in the intersection time ranges $\tau_{n3}$ (Hann or Hanning window).

It is self-evident that the present invention is not limited to the above-described embodiments. For instance, several of the described measures and arrangements can be combined with one another. Modifications and alternatives which, though not explicitly detailed, become apparent to the person skilled in the art in the course of reading, are also included within the scope of protection.

The invention claimed is:

1. An FMCW radar, comprising:
   a tunable microwave signal source for outputting a microwave signal, said tunable microwave signal source having an input and an output;
   a phase-locked loop having an input, a further input, and an output;
   an adjustable frequency divider connected between said output of said tunable microwave signal source and said input of said phase-locked loop;
   a loop filter connected between said output of said phase-locked loop and said input of said tunable microwave signal source; and
   a reference signal source connected to said further input of said phase-locked loop.

2. The FMCW radar according to claim 1, wherein said frequency divider is a digitally settable frequency divider.

3. The FMCW radar according to claim 1, which comprises a further frequency divider connected between said reference signal source and said phase-locked loop, wherein at least one of said frequency dividers is an adjustable frequency divider.

4. The RMCW radar according to claim 3, wherein said further frequency divider is a digitally settable frequency divider.

5. A method of operating an FMCW radar, which comprises:
   setting a tunable microwave signal source by way of a closed-loop circuit using a reference signal of a reference signal source as a reference variable and a frequency-divided output signal of the microwave signal source as a feedback variable.

6. The method according to claim 5, which comprises using a quartz oscillator as the reference signal source.

7. The method according to claim 5, which comprises using a frequency-divided reference signal of a reference signal source as the reference variable.

8. A method for adaptively correcting an FMCW background signal, which comprises the following steps:
   recording an FMCW radar signal;
   determining a most probable FMCW radar background signal from a plurality of FMCW radar background signals;
   comparing the recorded FMCW radar signal with the most probable FMCW radar background signal; and
   if the recorded FMCW radar signal differs from the most probable FMCW radar background signal by less than a predetermined threshold value, storing the recorded FMCW radar signal as the FMCW radar background signal.

9. The method according to claim 8, which comprises generating the most probable FMCW radar background signal from an average of a plurality of FMCW radar background signals.

10. A method for suppressing an FMCW radar background signal, which comprises the following steps:
    recording an FMCW radar signal;
    determining a most probable FMCW radar background signal from a plurality of FMCW radar background signals;
    comparing the recorded FMCW radar signal with the most probable FMCW radar background signal; and
    if the recorded FMCW radar signal differs from the most probable FMCW radar background signal by more than a predetermined threshold value, subtracting the most probable FMCW radar background signal from the recorded FMCW radar signal.

11. The method according to claim 10, which comprises generating the most probable FMCW radar background signal from an average of a plurality of FMCW radar background signals.

12. A method for interference suppression of at least one, two, or more FMCW radars, which comprises temporally offsetting respective frequency ramps of mutually interfering FMCW radars relative to one another.

13. The method according to claim 12, which comprises shifting a start time of the respective frequency ramps.

14. The method according to claim 13, which comprises shifting the start time of the ramps in such a way that an interference signal lies outside a bandwidth of an intermediate frequency filter.

15. The method according to claim 13, which comprises shifting the start time of the ramps randomly.

16. The method according to claim 15, which comprises shifting by selecting one of the following: varying a sign of a time offset per FMCW radar, varying an amount of a time offset per FMCW radar, by means of a determination of a number of ramps up to a synchronization, and omitting a ramp.

* * * * *